US00RE34802E

United States Patent [19]

Sayag

[11] E Patent Number: Re. 34,802

[45] Reissued Date of Patent: Nov. 29, 1994

[54] NON-LINEAR PHOTOSITE RESPONSE IN CCD IMAGERS

[75] Inventor: Michel Sayag, Mountain View, Calif.

[73] Assignee: Loral Fairchild Corporation, Syosset, N.Y.

[21] Appl. No.: 134,162

[22] Filed: Oct. 8, 1993

Related U.S. Patent Documents

Reissue of:

[64] Patent No.: 5,055,667
Issued: Oct. 8, 1991
Appl. No.: 541,579
Filed: Jun. 21, 1990

[51] Int. Cl.[5] ..... H01J 40/14

[52] U.S. Cl. ..... 250/208.1; 348/299

[58] Field of Search ..... 250/208.1; 257/445, 257/461; 348/299, 314, 315

[56] References Cited

U.S. PATENT DOCUMENTS

| | | | |
|---|---|---|---|
| 3,403,284 | 9/1968 | Buck et al. . | |
| 3,465,159 | 9/1969 | Stern . | |
| 3,845,295 | 10/1974 | Williams et al. . | |
| 3,896,485 | 7/1975 | Early . | |
| 3,916,429 | 10/1975 | Kostelec . | |
| 3,931,465 | 1/1976 | Levine . | |
| 3,932,775 | 1/1976 | Kosonocky . | |
| 3,996,600 | 12/1976 | Patrin . | |
| 4,174,528 | 11/1979 | White . | |
| 4,206,371 | 6/1980 | Weimer . | |
| 4,322,753 | 3/1982 | Ishihara . | |
| 4,450,484 | 5/1984 | Terakawa et al. . | |
| 4,473,836 | 9/1984 | Chamberlain . | |
| 4,488,165 | 12/1984 | Levine . | |
| 4,590,505 | 5/1986 | Bluzer . | |
| 4,620,214 | 10/1986 | Margalit et al. . | |
| 4,636,980 | 1/1987 | Bluzer . | |
| 4,641,169 | 2/1987 | Inuiya | 257/444 |
| 4,651,180 | 3/1987 | Nishizawa et al. . | |
| 4,656,494 | 4/1987 | Kobayashi et al. . | |
| 4,694,318 | 9/1987 | Capasso et al. . | |
| 4,845,566 | 7/1989 | Sakai et al. . | |
| 4,849,814 | 7/1989 | Van De Steeg . | |
| 4,903,284 | 2/1990 | Esser . | |
| 5,014,132 | 5/1991 | Kumesawa et al. | 348/315 |

FOREIGN PATENT DOCUMENTS 1173542 8/1984 Canada .

OTHER PUBLICATIONS

Amelio, "Charge-Coupled Devices," Reprinted from Scientific American, Feb. 1974; pp. 296-303.

Theuwissen et al., "The Accordion Imager: an ultra High Density Frame Transfer CCD," *IEDM*, pp. 40-43 (1984).

Chamberlain et al., "A Novel Wide Dynamic Range Silicon Photodetector and Linear Imaging Array," *IEEE Transactions on Electronic Devices*, vol. ED-31, No. 2, pp. 175-182, Feb. 1984.

Meindl, "Microelectronic Circuit Elements", *Microelectronics: A Scientific American Book*, pp. 22-23, Piel et al., eds., W. H. Freeman & Co., San Francisco, Calif., 1977.

*Primary Examiner*—David C. Nelms

*Assistant Examiner*—K. Shami

*Attorney, Agent, or Firm*—Townsend and Townsend Khourie and Crew

[57] ABSTRACT

A method of controlling the dynamic range of a CCD or similar device. The method is used in connection with a charge-coupled device or like structure of known construction having a photogate region in which charge is generated at a rate proportional to the intensity of incident electromagnetic radiation. The photogate accumulates charge during a predetermined exposure period. A sink region is disposed to receive excess charge from the photogate region, and the passage of charge from the photogate region to the sink region is controlled by a control gate of the type commonly used for integration control. A second gated region is present for receiving charge from the photogate region for transporting charge therefrom. A potential is applied to the control gate which has a magnitude causing all charge above a certain charge clipping level in the photogate region to pass to the sink region, and the magnitude of the potential is caused to vary during the exposure period according to predetermined function, which may be a non-linear function such as logarithmic. In this way the clipping level varies according to the predetermined function in real time during the exposure period. The total charge accumulated in the photogate region, limited according to the predetermined function, is then transferred to the second gated region at the end of the exposure period.

24 Claims, 2 Drawing Sheets

NON-LINEAR PHOTOSITE RESPONSE IN CCD IMAGERS

Matter enclosed in heavy brackets [ ] appears in the original patent but forms no part of this reissue specification; matter printed in italics indicates the additions made by reissue.

BACKGROUND OF THE INVENTION

The present invention relates generally to semiconductor devices, such as charge-coupled devices (CCDs"), in which charge representative of an input signal is collected and manipulated. More specifically, the invention relates to techniques for extending the dynamic range of such devices.

Charge-coupled devices, bucket brigade devices and other semiconductor devices in which charge is manipulated are well known. Such devices are used as shift registers, as memory cells, in analog signal processing as filters, and as charge-coupled imaging devices, both for line scan and area imaging purposes. The operation of these devices is similar in that depletion regions are created in a semiconductor substrate by application of an electric field, which regions are energetically favorable to the accumulation of charges. Accumulated packets of charge are then manipulated in these regions according to the needs of the particular application.

In known charge-coupled devices an initial charge may be injected into such a region electrically from circuit associated elements, such as in memory cell devices, or the charge may be generated within the region in response to incident radiant energy (i.e., visible light or infrared radiation), such as in imaging devices. In a CCD imaging device, charges are generated in a region of the semiconductor substrate, generally referred to as the photosite, which is sensitive to the incident radiation. The charges are allowed to accumulate, in a region referred to as the photogate, for a period of time generally referred to as the integration time. The amount of charge accumulated in the photogate region over an integration period provides a measure of the average radiant energy impinging on the photosite during the integration period. After each integration period the accumulated charge is transferred to a temporary storage region of the semiconductor substrate, typically forming a part of a shift register, where the charge is then passed to various circuit elements to be detected, amplified, and/or otherwise processed to provide an output signal representative of the incident light intensity.

A limitation on known charge-coupled devices is the relationship between the amount of charge which may be accumulated in the photogate region and the charged-handling capability required of all of the peripheral circuitry, such as the temporary storage location to which the photogate charge is transferred in the shift register. Increasing the size of the photogate allows more charge to accumulate over a given period and provides greater overall dynamic range for the device; however, such an increase in size also places a correspondingly higher requirement of the charge-handling capability of the shift register or other circuitry. Thus, the size of charge-coupled devices sufficient to provide wide dynamic range is undesirably increased by the extra charge-handling capability required. The increase in size of the shift registers and associated peripheral circuitry in turn increases the size of the dies used in manufacturing, which lowers the yield of functioning devices and increases the price for each device. Viewed alternatively, the increased size of the peripheral charge-handling circuitry decreases the chip area available for photosensing, and thereby lowers the dynamic range of the device.

One known approach for handling the occasional overcapacity of the photogate region was developed in connection with the phenomenon known as "blooming." The temporary storage region can hold a limited quantity of charge and/or can only transfer a limited quantity of charge at a time out of the region. If the quantity of charge accumulating in the photogate region exceeds the capacity of the associated temporary storage region, then when the charge is transferred from the photogate region, the temporary storage region exceeds its saturation limit and the excess charge spreads to neighboring regions associated with other light-sensing elements. This spreading or smearing of the charge is known as blooming and leads to a local loss of image resolution and diminishes the effective dynamic range of the device.

To counteract the blooming effect, an additional structure is provided on the CCD chip to handle excess charge. An antiblooming structure comprising a "sink" region and appropriate electrodes and gates is added adjacent to the photogate to receive the excess charge. In one approach charge is allowed to accumulate in the photogate for an integration time which is only a predetermined fraction of the exposure time. This is accomplished by opening a gate between the photogate and the sink for a fraction of the exposure period such that all the charge generated in the photosite when the gate is open is diverted to the sink. The remainder of the exposure period then provides the integration period. Only the fraction of the generated charge accumulated during the integration period is transferred to the temporary region in the shift register. In a further refinement an integration control gate may be biased such that even during the integration period accumulated charge exceeding the saturation level of the associated temporary storage region will be diverted to the sink. These techniques reduce the occurrence of blooming and provide improved dynamic range.

SUMMARY OF THE INVENTION

The present invention provides a method of controlling a CCD or similar device to achieve greater dynamic range and better performance than achievable by the above-described techniques, while permitting variable control over the sensitivity of the device to light intensities in predetermined ranges. The method may be applied to known semiconductor structures such as the antiblooming structure described above.

Briefly, the method is used in connection with a charge-coupled device or like structure of known construction, having a first gated region such as a photosite in which charge is generated at a rate proportional to the intensity of electromagnetic radiation incident thereupon. The first gated region is structured and arranged to accumulate charge during a predetermined exposure period. The CCD further includes a sink region disposed for receiving excess charge from the first gated region and a control gate of the type commonly used for integration control for permitting passage of charge from the first gated region to the sink region. A second gated region is present for receiving charge from the first gated region for transporting charge therefrom. According to the invention a potential is applied to the control gate which has a magnitude causing all charge above a certain charge clipping level in the first gated region to pass to the sink region, and the magnitude of the potential is caused to vary during the exposure period according to a predetermined function. The predetermined function is preferably a non-linear monotonically increasing function, such as a logarithmic function. In this way the clipping level varies according to the predetermined function in rear time during the exposure period. The total charge accumulated in the first gated region, limited according to the predetermined function, is then transferred to the second gated region at the end of the exposure period.

DETAILED DESCRIPTION OF AN ILLUSTRATIVE EMBODIMENT

Figure 1:
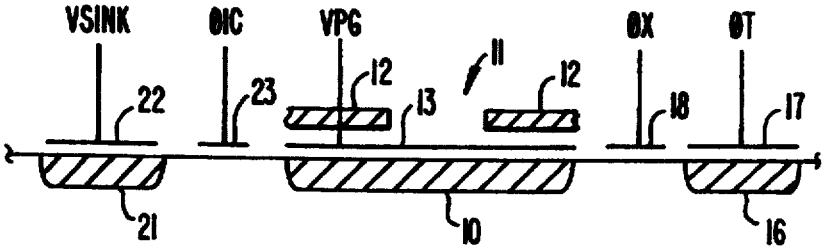
FIG. 1 is a schematic cross-sectional view of a CCD structure with which the method of the present invention may be practiced.

The CCD imaging device illustrated in FIG. 1 includes a first semiconductor region 10 for the accumulation of charge, which is referred to herein as the photogate region. The charge is generated in region 10 by light (or other from of radiant energy) impinging upon the photosensing area 11, which is referred to as the photosite. In the configuration of FIG. 1 photosite 11 is limited by light shields 12. A photogate electrode 13 overlies photogate region 10. An electric potential VPG is applied to photogate electrode 13, which maintains an electric field in the region 10 of appropriate character making it energetically favorable for charge to accumulate in the region. Adjacent photogate region 10 is a temporary storage region 16, sometimes referred to as the transport gate region, to which a charge packet accumulated in the photogate region is transferred. The region 16 typically forms a part of shift register or other transport structure for transporting the charge packet received from the photogate region to other circuit structures for processing. Overlying transport gate region 16 is transport gate electrode 17, to which a potential $\phi T$ is applied for enabling the accumulation of charge in region 16. A transfer gate electrode 18 is disposed between photogate 10 and transport gate 16. The passage of a charge packet from photogate 10 to transport gate 16 is determined by the potential $\phi X$ applied to transfer gate electrode 18.

Adjacent to photogate region 10 on another side from the transport gate is sink region 21 such as used in the above-referenced antiblooming structure. Sink region 21 has an overlying electrode 22, to which is a potential VSINK is applied to define the potential well for receiving excess charge from the photogate region. A control gate electrode 23, sometimes referred to as an integration control gate, is disposed between photogate 10 and sink 21 to control the flow of excess charge to the sink. According to the invention, greater improvements to dynamic range than in known antiblooming control methods may be achieved by applying a potential $\phi IC$ to integration control electrode 23 as described below.

Figure 2:
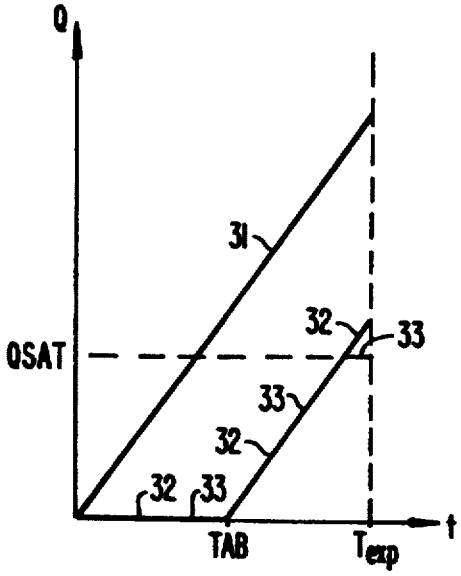
FIG. 2 is a graph of a accumulated photogate charge using known integration control and antiblooming techniques.

The method of the present invention may be understood by reference to FIG. 2, which plots the charge accumulated in photogate region 10 as a function of time. The "time" axis shows one exposure period, i.e., the period $T_{exp}$ between two consecutive transfers of charge packets from photogate region 10 to transport gate region 16. It is assumed that the radiant energy incident upon the photosite has a constant intensity over exposure period. For typical imaging applications light intensities vary slowly compared with the exposure time so that the approximation is valid. With no antiblooming control, i.e., if $\phi IC$ is 0, the accumulated charge is directly proportional to the elapsed time; and the proportionality constant is the average incident light intensity over the exposure period:

$$Q = I.T_{exp}. \quad (1)$$

The accumulated charge with no antiblooming control is represented by the straight line 31 in FIG. 2. The slope of the line 31 represents the incident light intensity; the greater the light intensity, the greater the slope. The charge QSAT indicated on the "charge" axis of FIG. 2 represents the saturation charge of the transport gate region 16 to which the accumulated charge is transferred from the photogate. If a charge greater than QSAT accumulates in the photogate, then blooming will occur. This is the case with the line 31 in the absence of antiblooming control.

In conventional antiblooming and integration control methods, a potential is applied to control gate 23 for a fixed predetermined fraction TAB of the exposure time so that all of the charge generated in the photosite passes to sink 21, and no charge accumulates in the photogate region 10. At time TAB sink 21 is blocked, and the charge accumulates linearly in proportion to the incident radiation for the remainder of the exposure period. Line 32 in FIG. 2 represents the same incident radiation as the line 31, but with the integration control just described. As a refinement to the integration control method just described, it is also known to bias the integration control gate at a constant level during the integration period such that any charge accumulated in excess of the saturation level of the transport region 16 will spill over into sink 21. This situation is represented by the line 3 in FIG. 2 for the same light intensity as the lines 31 and 32.

Figure 3:
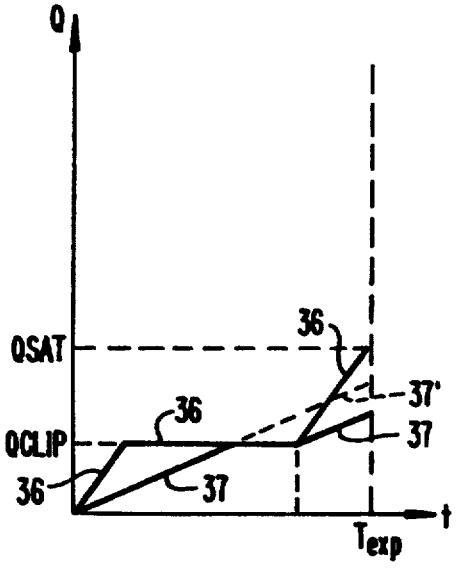
FIG. 3 is a graph of accumulated photogate charge in a simplified example for illustrating the present invention.

In the present invention the potential $\phi IC$ applied to the integration control gate 23 is set at a level to selectively limit, or "clip," the amount of charge accumulated in the photogate as that charge accumulates during the integration period and before the saturation level QSAT for the transport region 16 is reached. By way of introductory example, a piecewise linear charge accumulation curve may be achieved by applying a potential to the control gate 23 to establish a first clipping level QCLIP less than the transport region saturation level QSAT for a first portion of the exposure time, and then clipping at the QSAT level for the remainder of the exposure period. When control gate 23 is biased in this way, the charge accumulates continuously at a linear rate for low light intensities, but for higher light intensities a portion of the charge is diverted to sink 21 midway in the exposure period. The resulting charge accumulation curve is represented by the curve 36 in FIG. 3 for the same incident light intensity as the curves in FIG. 2. Also shown in FIG. 3 is a pair of curves 37 and 37' illustrating the resulting compression for an incident light intensity sufficiently low that the accumulated charge would not reach the saturation level even in the absence of clipping. Curve 37 illustrates the charge accumulation with an intermediate-threshold clipping level. Curve 37 illustrates the charge accumulation with the same incident light intensity but without the intermediate-threshold clipping.

Figure 4:
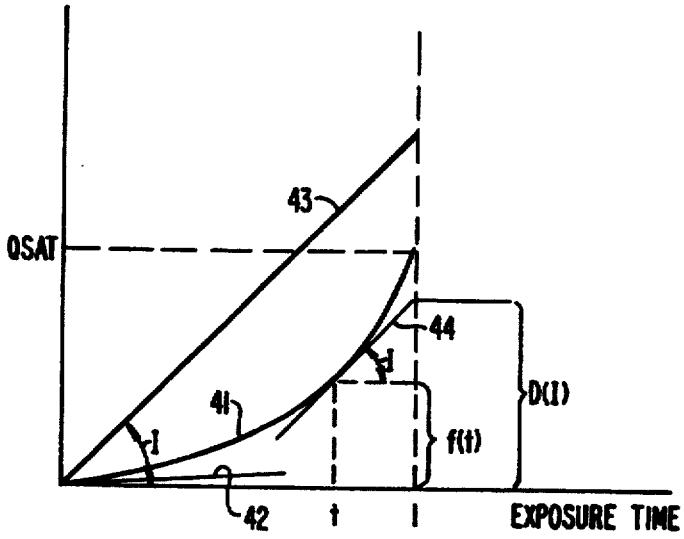
FIG. 4 is a graph showing accumulated photogate charge in a general example of the present invention.

FIG. 4 illustrates a more general example. The curve 41 of FIG. 4 represents the maximum acceptable charge desired to be accumulated in the photogate region at any fraction of the integration period.

By actively increasing the potential difference between photogate electrode 13 and integration control gate 23, i.e., by actively increasing $\phi IC$, during the integration period, the maximum acceptable charge level can be increased at the same rate. Curve 41 of FIG. 4 represents the maximum acceptable charge level QMAX in the photogate as a function of the normalized integration time $t=T/T_{exp}$, where as before $T_{exp}$ is the exposure period:

$$QMAX=f(t),\ (0\leqq t\leqq 1). \tag{2}$$

The function (f(t) can be mathematically determined and electronically generated on the chip so as to achieve a compression of the dynamic range in an arbitrarily chosen manner. The compression of the dynamic range is represented by a function D(I), which gives the output charge transferred to the transport gate from the photogate as a function of incident light intensity. As described above, with no antiblooming or integration control (the so-called linear accumulation case) the output charge to the transport gate is proportional to the incident intensity:

$$D_{linear}(I)=T_{exp}.I. \tag{3}$$

The determination of f(t) and its relation to an arbitrarily selected monotonic D(I) according to the present invention are described in the following paragraphs.

A graphical determination of the function f(t) will now be described with reference to FIG. 4. The straight line 42 is tangent to the curve 41 at the origin. The line 42 represents the charge accumulation curve for a predetermined constant incident light intensity IO. For incident radiation with intensity I less than IO, charge will be permitted to accumulate linearly in the photogate and would be represented in FIG. 4 by a straight line of slope less than IO. For incident radiation with intensity greater than IO, a linear accumulation of charge in the photogate would produce an amount of charge greater than the maximum acceptable charge QMAX and would be represented in FIG. 4 by a straight line, at least a portion of which would lie above Curve 41. This case is represented by the line 43 in FIG. 4. Without some form of antiblooming or integration control the charge generated by the incident radiation represented by line 43 will exceed the saturation level of the transport gate.

According to the present invention, a varying potential is applied to integration control gate 23 such that the charge in the photogate accumulates at the maximum permissible rate (i.e., along curve 41) until that rate reaches the rate the incident radiation would produce in the absence of compression (the "uncompressed" rate). Beyond that point the charge is permitted to accumulate at the uncompressed rate. In terms of the FIG. 4, the curve 41 is the clipping level above which charge is diverted to sink 21. For incident radiation of an intensity represented by the line 43, the photogate response follows the curve 41 to the point t at which the tangent 44 to curve 41 is parallel to the line 43. Thereafter, it follows the line 44. The following relation may be gleaned from FIG. 4:

$$D(I)=f(t)=I.(1-t). \tag{4}$$

More formally the methodology can be understood as follows. The charge accumulation produced by a given incident radiation of intensity I in the absence of compression is represented by a straight line of slope equal to I. In the absence of compression the output charge QOUT delivered to the transport gate is the of the straight line at the end of the exposure period. In the presence of compression the output charge QOUT is $$\begin{aligned} QOUT &= D(I) \\ &= f(t) + I\cdot(1-t) \end{aligned} \tag{5}$$

where now I is the slope of the tangent to curve 41 at t:

$$I=df/dt \tag{6}$$

The function f(t) is determined by specifying the compression function D(I), applying the chain rule for differentiation to D(I), differentiating Eqn. (5), and substituting:

$$\frac{dD}{dt}=\frac{dD}{dI}\cdot\frac{dI}{dt} \tag{7}$$

$$=\frac{dI}{dt}\cdot(1-t)-I+\frac{df}{dt} \tag{8}$$

$$=\frac{dI}{dt}\cdot(1-t). \tag{9}$$

yielding $$\frac{dD}{dI}=(1-t). \tag{10}$$

To illustrate the solution of this equation, assume the following compression function, including logarithmic and linear ranges:

$$D=\begin{cases} I, & \text{for } 0\leqq I\leqq IO. \\ IO\cdot(1+\ln(I/IO)), & \text{for } IO\leqq I\leqq Imax, \\ Imax, & \text{for } I\geqq Imax. \end{cases} \tag{11}$$

With a compression ratio of $$c=Isat/Imax,\ tm\ (13)$$

the linear range $$r=IO/Isat \tag{13}$$

is given by the relation $$r-\ln(r.c)=1. \tag{14}$$

For example, if the compression ratio c is 0.1, then the linear range r is 0.2.

Equation (10) leads to:

$$\frac{dD}{dI} = \frac{IO}{I} = 1 - t: \tag{15}$$

therefore $$\frac{df}{dt} = I \tag{16}$$

$$= IO/(1 - t). \tag{17}$$

The solution is:

$$f(t) = \begin{cases} IO \cdot \ln(1 - t), & 0 \leqq t \leqq max, \\ ISAT - IMAX \cdot (1 - t), & max \leqq t \leqq 1, \end{cases} \tag{18}$$

where $$tmax - 1 - r.c. \tag{19}$$

Figure 5:
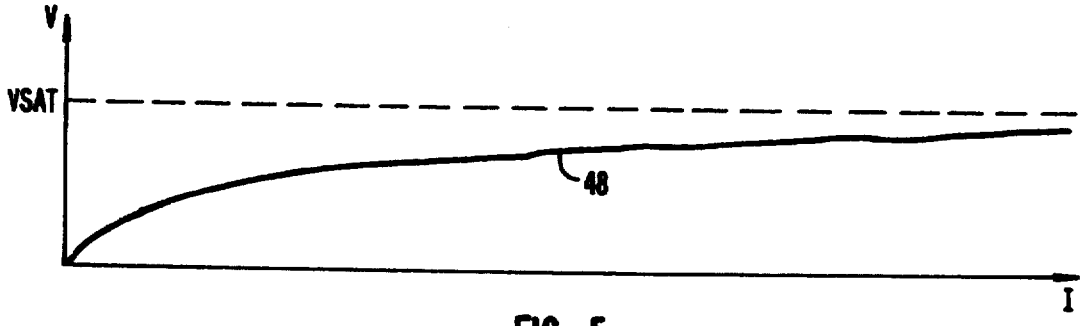
FIG. 5 is a graph showing logarithmic compression of dynamic range according tot he invention.

In FIG. 5 the graph 48 plots the resulting CCD output voltage as a function of incident light intensity for the "logarithmic" compression function. The potential at the output of the device is directly proportional to the charge transferred to the transport gate.

The operation of the invention has been described above in connection with a single photosite. CCD devices are commonly arranged in linear or area arrays of photosites. Analogous control gates for the plurality of sites are commonly clocked together in order to achieve identical response characteristics for all photosites.

The invention has been described above with reference to specific embodiments. It should now be apparent to those skilled in the art that the invention enables one to produce a non-linear relation of the designer's choosing between the incident light and the amount of charge accumulated in the photogate. Accordingly, it is not intended that the invention be limited except as provided by the appended claims.

What is claimed is:

1. A method of controlling the response of a charge-coupled device to incident electromagnetic radiation, said device having a first gated region for accumulating charge in response to incident electromagnetic radiation wherein said first gated region is structured and arranged to accumulate charge during a predetermined exposure period, a sink region disposed for receiving excess charge from said first gated region, a control gate for permitting passage of charge form said first gated region so said sink region, and a second gated region receiving charge from said first gated region for transporting charge therefrom, said method comprising the steps of:

applying a potential to said control gate having a magnitude causing all charge above a charge clipping level in said first gated region to pass to said sink;

causing the magnitude of said potential to vary during said exposure period according to a predetermined function whereby said clipping level varies correspondingly during said exposure period; and causing the total charge accumulated in said first gated region to be transferred to said second gated region at the end of said predetermined exposure period.

2. The method of claim 1 wherein said potential is caused to vary continuously over at least a portion of said exposure period.

3. The method of claim 2 wherein said potential is caused to vary according to a prescribed non-linear monotonic function.

4. The method of claim 3 wherein said non-linear monotonic function increases from a substantially zero clipping level at the onset of said exposure period.

5. The method of claim 4 wherein said non-linear monotonic function is proportional to $$\ln(1/(1-t)).$$

where t is the elapsed time in said predetermined exposure period.

6. A method of controlling the response of a charge-coupled device to incident electromagnetic radiation, said device having a first gated region for generating charge at a rate proportional to the intensity of electromagnetic radiation incident thereupon wherein said first gated region is structured and arranged to accumulate charge during a predetermined exposure period, a sink region disposed for receiving excess charge from said first gated region, a control gate for permitting passage of charge from said first gated region to said sink region, and a second gated region receiving charge from said first gated region for transporting charge therefrom, said method comprising the steps of:

for an incident light intensity greater than a predetermined intensity, causing charge to accumulate in said first gated region during a first portion of said predetermined exposure period at a rate specified by a predetermined non-linear function varying from a first rate representative of said predetermined intensity to a second rate representative of said incident light intensity, any excess charge being diverted to said sink region;

causing charge to accumulate in said first gated region at said second rate for the remainder of said predetermined exposure period; and causing the total charge accumulated in said first gated region to be transferred to said second gated region at the end of said predetermined exposure period.

7. The method of claim 6 wherein charge is caused to be accumulated in said first gated region at a rate at varying logarithmically over time between said first and second rates.

*8. A method for controlling the response of a charge-coupled device to incident electromagnetic radiation, said device having a first gated region for accumulating charge in response to incident electromagnetic radiation, wherein said first gated region is structured and arranged to accumulate charge during an exposure period, said method comprising the steps of:*

*applying a potential to said charge-coupled device having a magnitude preventing all charge above a charge clipping level from accumulating in said first gated region; and*

*causing the magnitude of said potential to vary during said exposure period according to a predetermined function whereby said clipping level varies correspondingly during said exposure period.*

*9. The method of claim 8 wherein said potential is caused to vary continuously over at least a portion of said exposure period.*

*10. The method of claim 9 wherein said potential is caused to vary according to a prescribed non-linear monotonic function.*

*11. The method of claim 10 wherein said non-linear monotonic function increases from a substantially zero clipping level at the onset of said exposure period.*

*12. The method of claim 11 wherein said non-linear monotonic function is proportional to*

$$ln(1/(1-t)),$$

*where t is the elapsed time in said exposure period.*

*13. A method of controlling the response of a charge-coupled device to incident electromagnetic radiation, said device having a first gated region for accumulating charge in response to incident electromagnetic radiation, wherein said first gated region is structured and arranged to accumulate charge during an exposure period, and a second gated region receiving charge from said first gated region for transporting charge therefrom, said method comprising the steps of:*

*applying a potential to said charge-coupled device having a magnitude preventing all charge above a charge clipping level from accumulating in said first gated region;*

*causing the magnitude of said potential to vary during said exposure period according to a predetermined function whereby said clipping level varies correspondingly during said exposure period; and*

*causing the total charge accumulated in said first gated region to be transferred to said second gated region at the end of said exposure period.*

*14. The method of claim 13 wherein said potential is caused to vary continuously over at least a portion of said exposure period.*

*15. The method of claim 14 wherein said potential is caused to vary according to a prescribed non-linear monotonic function.*

*16. The method of claim 15 wherein said non-linear monotonic function increases from a substantially zero clipping level at the onset of said exposure period.*

*17. The method of claim 16 wherein said non-linear monotonic function is proportional to*

$$ln(1/(1-t)),$$

*where t is the elapsed time in said exposure period.*

*18. A charge-coupled device, comprising:*

*a first gated region for accumulating charge in response to incident electromagnetic radiation, wherein said first gated region is structured and arranged to accumulate charge during a predetermined exposure period, said charge not exceeding a charge clipping level, said charge clipping level varying over said exposure period according to a predetermined function;*

*a sink region disposed for receiving excess charge from said first gated region;*

*a control gate for permitting passage of charge from said first gated region to said sink region; and*

*a second gated region for receiving charge from said first gated region and for transporting charge therefrom.*

*19. The charge-coupled device of claim 18 wherein said charge clipping level varies continuously over at least a portion of said exposure period.*

*20. The charge-coupled device of claim 19 wherein said charge clipping level varies according to a prescribed non-linear monotonic function.*

*21. The charge-coupled device of claim 10 where in said non-linear monotonic function increases from a substantially zero clipping level at the onset of said exposure period.*

*22. The charge-coupled device of claim 21 wherein said non-linear monotonic function is proportional to*

$$ln(1/(1-t)),$$

*where t is the elapsed time in said exposure period.*

*23. A charge-coupled device, comprising:*

*a first gated region for generating charge in response to incident electromagnetic radiation, wherein for an incident light intensity greater than a first light intensity said first gated region generates charge at a rate specified by a predetermined non-linear function varying from a first rate representative of said first intensity to a second rate representative of said incident light intensity during a first portion of an exposure period, and wherein said first gated region generates charge at said second rate for the remainder of said exposure period;*

*a sink region disposed for receiving excess charge from said first gated region;*

*a control gate for permitting passage of charge from said first gated region to said sink region; and*

*a second gated region for receiving and transporting charge from said first gated region.*

*24. The charge-coupled device of claim 23, wherein said first gated region generates charge at a rate varying logarithmically over time between said first and second rates.*

* * * * *